US010074571B1

(12) United States Patent
Greene et al.

(10) Patent No.: US 10,074,571 B1
(45) Date of Patent: Sep. 11, 2018

(54) DEVICE WITH DECREASED PITCH CONTACT TO ACTIVE REGIONS

(71) Applicant: GLOBALFOUNDRIES INC., Grand Cayman (KY)

(72) Inventors: Brian J. Greene, Wappingers Falls, NY (US); Shreesh Narasimha, Beacon, NY (US); Scott R. Stiffler, Sharon, CT (US)

(73) Assignee: GLOBALFOUNDRIES INC., Grandy Cayman (KY)

( * ) Notice: Subject to any disclaimer, the term of this patent is extended or adjusted under 35 U.S.C. 154(b) by 0 days.

(21) Appl. No.: 15/451,869

(22) Filed: Mar. 7, 2017

(51) Int. Cl.
| | |
|---|---|
| *H01L 21/336* | (2006.01) |
| *H01L 21/8234* | (2006.01) |
| *H01L 21/762* | (2006.01) |
| *H01L 27/088* | (2006.01) |
| *H01L 29/66* | (2006.01) |

(52) U.S. Cl.
CPC ........ *H01L 21/823481* (2013.01); *H01L 21/76224* (2013.01); *H01L 21/823412* (2013.01); *H01L 21/823431* (2013.01); *H01L 21/823437* (2013.01); *H01L 21/823475* (2013.01); *H01L 27/0886* (2013.01); *H01L 29/66545* (2013.01)

(58) Field of Classification Search
CPC ............... H01L 21/823481; H01L 21/76224
USPC .......................................... 438/283
See application file for complete search history.

(56) References Cited

U.S. PATENT DOCUMENTS

| | | | |
|---|---|---|---|
| 9,461,168 B1* | 10/2016 | Ok | H01L 29/1054 |
| 9,576,857 B1* | 2/2017 | Xie | H01L 21/76224 |
| 9,929,157 B1* | 3/2018 | Xie | H01L 27/0886 |
| 2014/0080275 A1* | 3/2014 | Harley | H01L 29/66545 438/283 |
| 2015/0129982 A1* | 5/2015 | Kerber | H01L 27/0886 257/401 |
| 2017/0062233 A1* | 3/2017 | Cheng | H01L 21/31 |
| 2017/0062590 A1* | 3/2017 | Cheng | H01L 21/31 |
| 2017/0213741 A1* | 7/2017 | Cheng | H01L 21/3086 |
| 2017/0243956 A1* | 8/2017 | Cheng | H01L 29/66795 |

* cited by examiner

*Primary Examiner* — Jami M Valentine
(74) *Attorney, Agent, or Firm* — Scully Scott Murphy and Presser; Frank Digiglio

(57) ABSTRACT

A fin cut process cuts semiconductor fins after forming sacrificial gate structures that overlie portions of the fins. Selected gate structures are removed to form openings and exposed portions of the fins within the openings are etched. An isolation dielectric layer is deposited into the openings and between end portions of the cut fins. The process enables a single sacrificial gate structure to define the spacing between two active regions on dissimilar electrical nets.

19 Claims, 6 Drawing Sheets

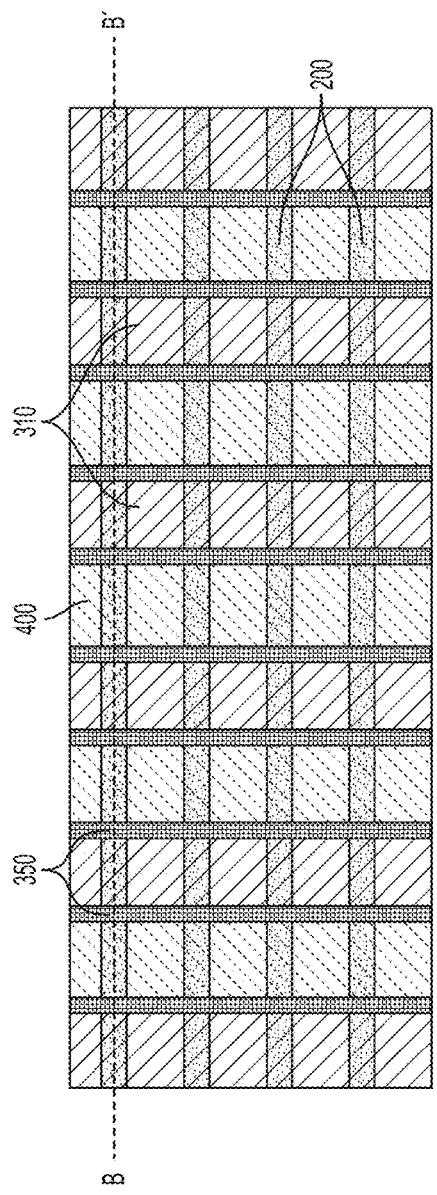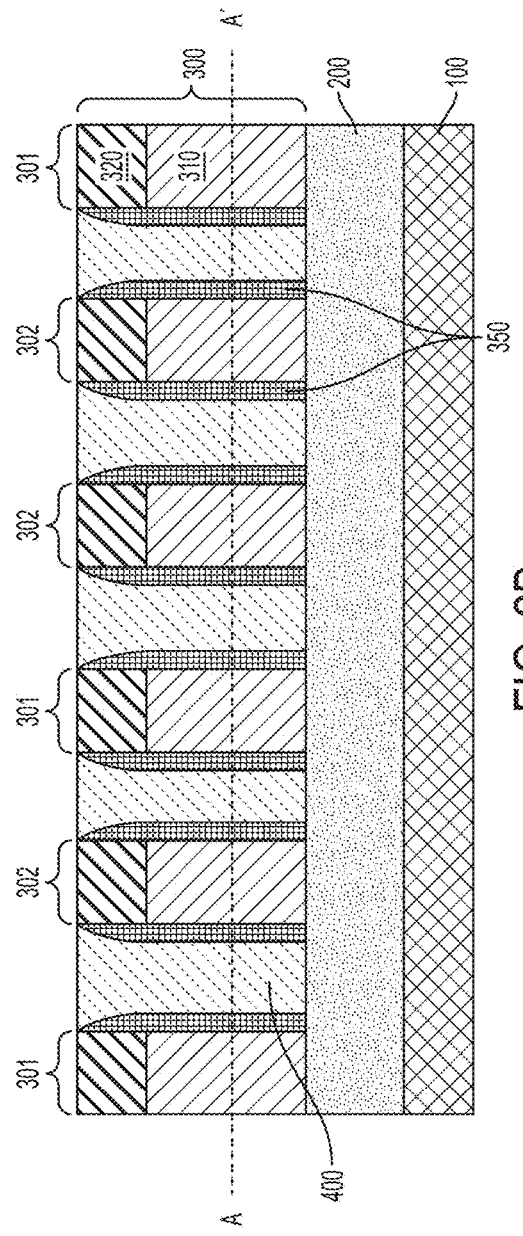
FIG. 2A
FIG. 2B

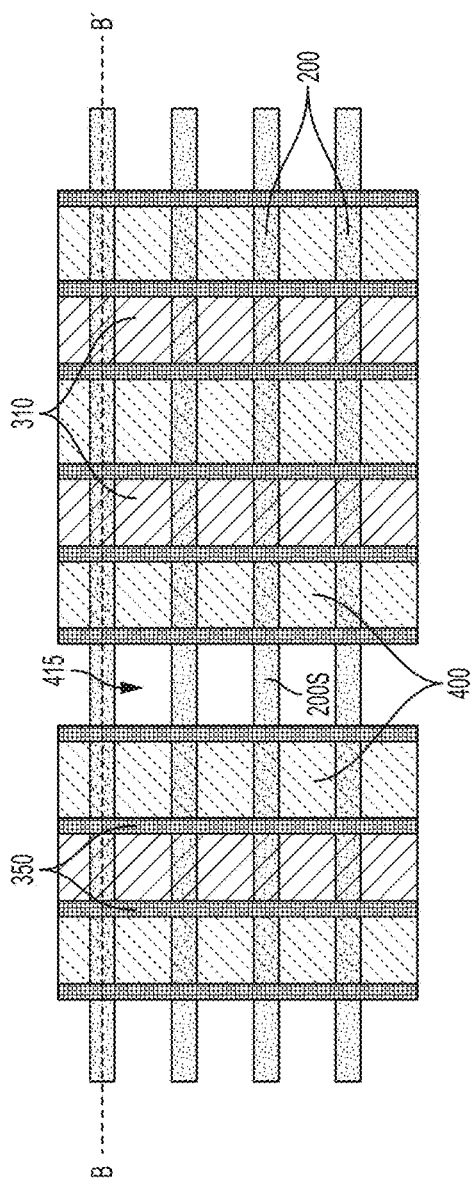
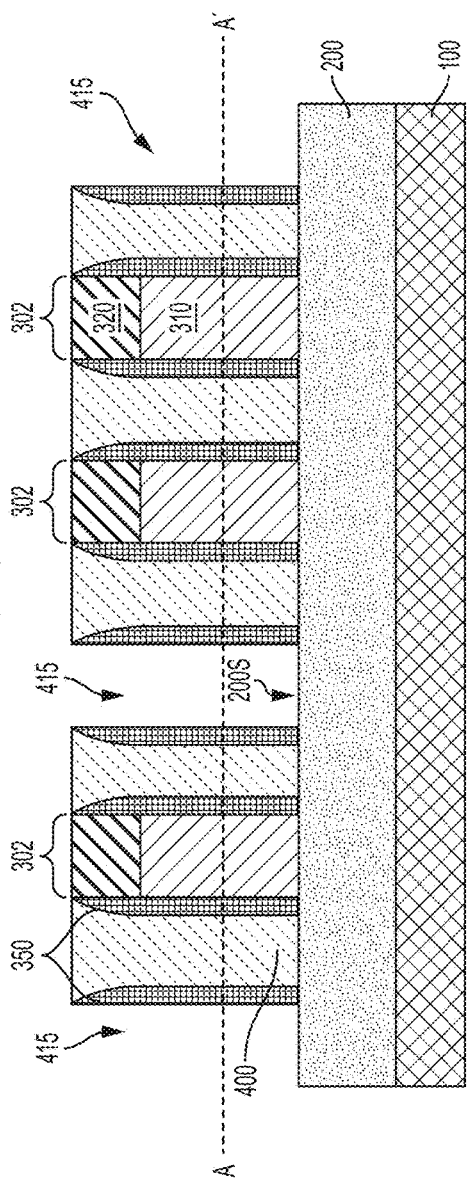
FIG. 3A
FIG. 3B

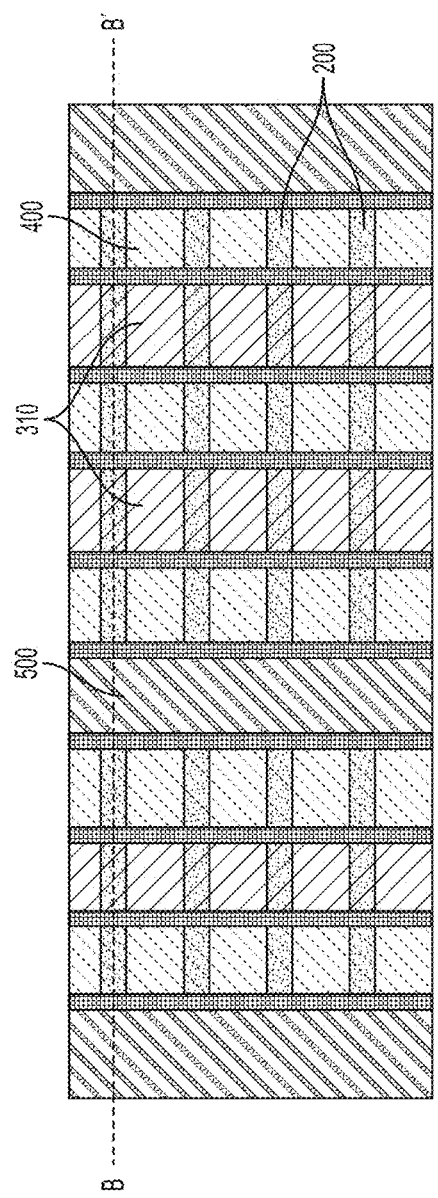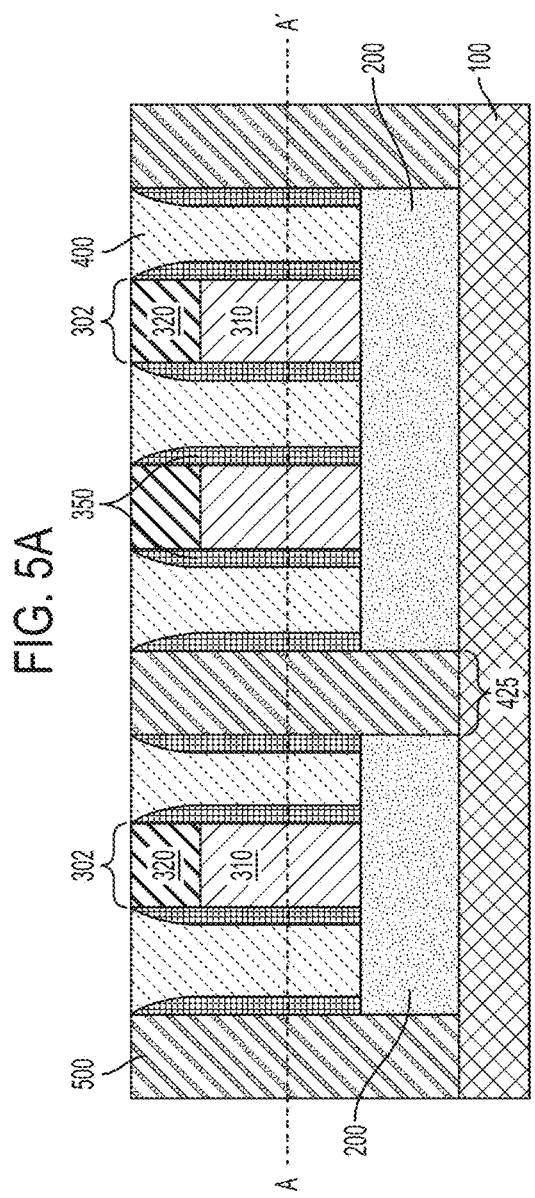
FIG. 5A
FIG. 5B

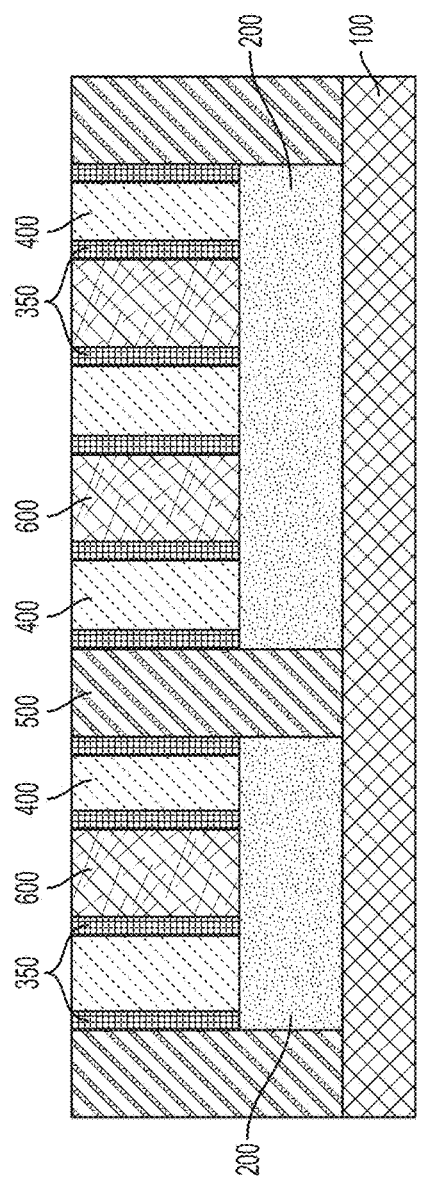
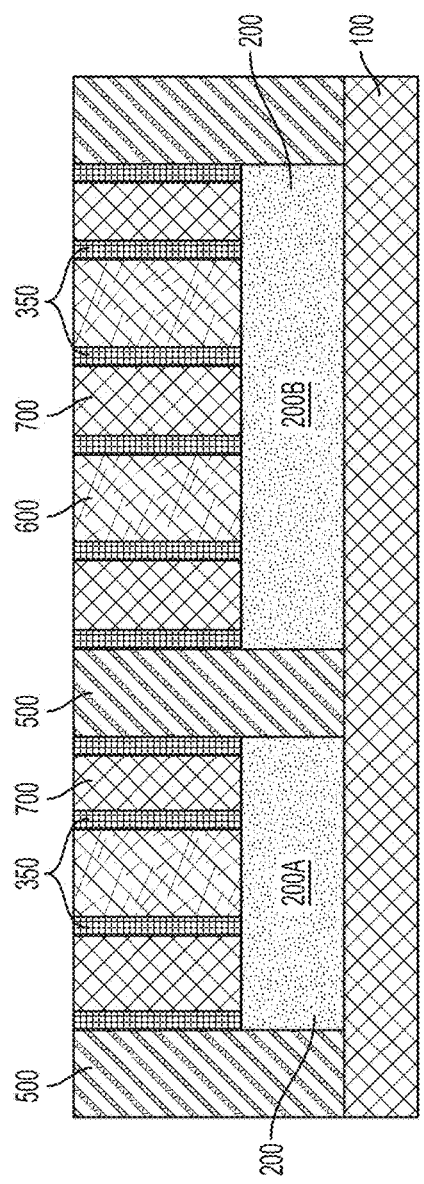

US 10,074,571 B1

DEVICE WITH DECREASED PITCH CONTACT TO ACTIVE REGIONS

BACKGROUND

The present application relates generally to the manufacture of semiconductor devices, and more specifically to the formation of isolation regions between adjacent devices, and particularly between adjacent devices that perform different functions or are positioned on different electrical nets.

A trend in the development of semiconductor manufacturing technologies has been to increase the density of devices per chip, and hence decrease the areal dimensions associated with each device. This trend applies not only to the structures formed in device regions per se, but also to inter-device structures such as isolation structures between active regions, which can occupy a relatively large area of a device or chip.

A number of techniques are known for providing isolation between adjacent devices. In a process using shallow trench isolation (STI), for example, active regions are typically defined in a semiconductor substrate and device isolation regions are then etched into the semiconductor substrate to form trenches that are backfilled with a dielectric material. However, such a process is limited by lithographic dimensions, which place a lower limit on both the trench width and the associated device-to-device spacing, i.e., pitch.

SUMMARY

It is recognized that economic integration methods at advanced nodes are desired. There is a need, therefore, for robust methods and structures that provide effective device isolation while using a decreased fraction of real estate.

In accordance with embodiments of the present application, disclosed is a method for forming self-aligned isolation structures that present a small areal dimension. Pre-existing sacrificial gate architectures are leveraged to define the location of the isolation structures, which also beneficially decreases the constraints associated with small lithographic dimensions.

Also disclosed is a method for achieving controlled epitaxial growth while maintaining the ability to contact adjacent active regions on dissimilar electrical nets without skipping a contacted poly pitch to do so, thus providing an area scaling benefit over known methods.

According to various embodiments, active fin regions remain un-cut through a front end process flow until after the gate cut module. Specifically, the disclosed method of forming a semiconductor device involves fabricating a plurality of fins on a semiconductor substrate and forming a plurality of sacrificial gate structures overlying a channel portion of each of the fins. Dielectric sidewall spacers are formed on sidewalls of the sacrificial gate structures. The sidewall spacers also abut top and sidewall surfaces of the fins.

A first dielectric layer is formed over exposed portions of the fins and over the sidewall spacers between adjacent sacrificial gate structures. Then, a first sacrificial gate structure is removed from over the channel portion of at least one fin to form an opening wherein the channel portion of the fin is exposed. The portion of the fin that is exposed through the opening is removed to form a cut fin, and an isolation dielectric layer is formed within the opening and between opposing end surfaces of the cut fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2A shows the structure of FIG. 1A after forming a dielectric layer between adjacent sacrificial gate structures;

FIG. 2B is a cross-sectional view of the structure of FIG. 2A;

FIG. 3A shows the removal of a plurality of selected sacrificial gate structures;

FIG. 3B illustrates exposed portions of a fin at the bottoms of openings formed by removal of the sacrificial gate structures;

FIG. 5A shows the deposition of an isolation dielectric material into the openings of FIG. 4A;

FIG. 5B is a cross-sectional view of the structure of FIG. 5A showing the formation of isolated active regions;

FIG. 6 is a cross-sectional view of the planarized structure of FIG. 5B following a replacement metal gate process; and FIG. 7 shows the formation of contacts to the source and drain regions of isolated active regions.

DETAILED DESCRIPTION

Figure 1A:
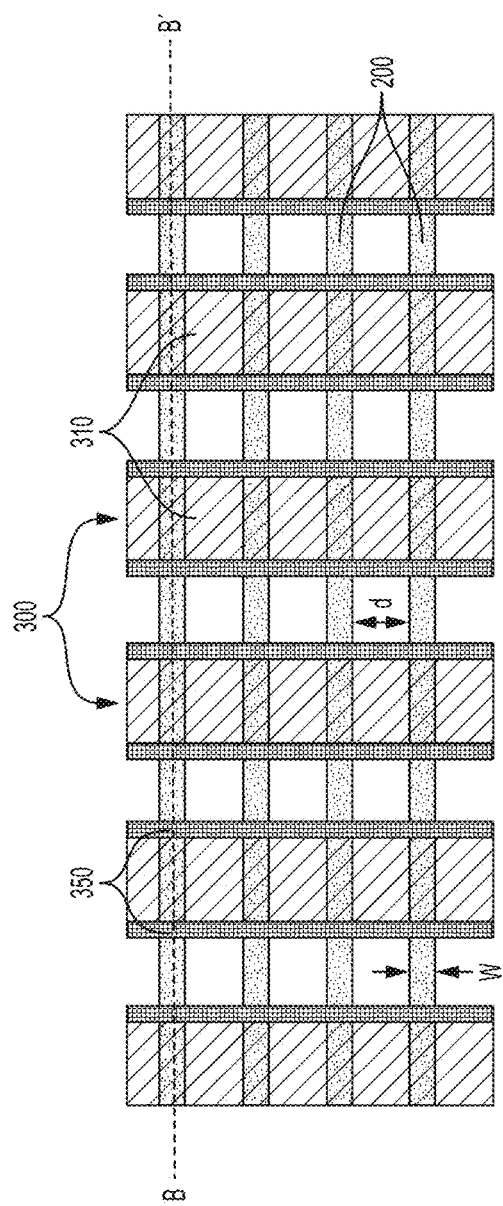
FIG. 1A is a top-down plan view showing a plurality of sacrificial gate structures and corresponding sidewall spacers overlying a plurality of semiconductor fins.

Reference will now be made in greater detail to various embodiments of the subject matter of the present application, some embodiments of which are illustrated in the accompanying drawings. The same reference numerals will be used throughout the drawings to refer to the same or similar elements. It is noted that the drawings are provided for illustrative purposes and, as such, may not be drawn to scale.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Embodiments of the application relate generally to the manufacture of semiconductor devices, and more particularly to the manufacture of fin field effect transistors (FinFETS). To define separate devices, the length of the fins may be adjusted and some fins or portions of fins may be removed. For example, a fin cut or "FC cut" process cuts fins in the widthwise direction. As disclosed herein, exemplary methods include forming sacrificial gate structures overlying portions of semiconductor fins, and then cutting the fins by removing selected gate structures to form openings and etching the portion of the fins exposed within the openings. An isolation dielectric is deposited into the openings and between end portions of the cut fins. The resulting structure permits a single sacrificial gate to define the spacing between two active regions on dissimilar electrical nets.

As used herein, the term "electrical net" or "electrical network" refers to an interconnection of electrical components or devices configured to be at a given electrical potential. Thus, structures or devices situated on different electrical nets may be at different electrical potentials. Effective inter-device isolation is needed to provide adjacent devices on different electrical nets.

Figure 1B:
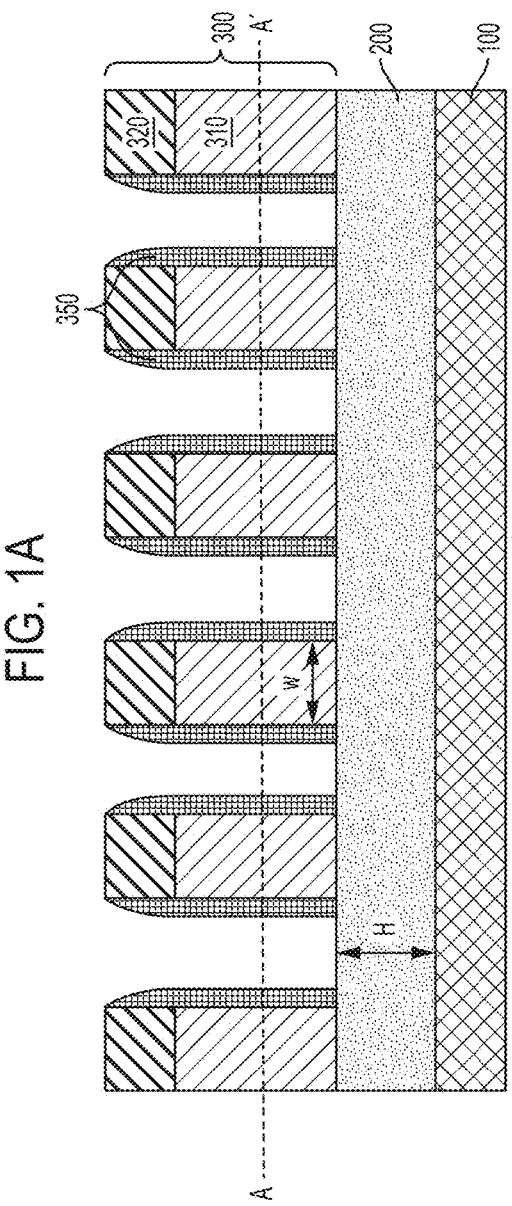
FIG. 1B is a cross-sectional view of the structure of FIG. 1A showing sacrificial gate structures over a semiconductor fin and sidewall spacers disposed over sidewalls of the sacrificial gate structures.

With reference to FIGS. 1A and 1B, a semiconductor structure according to various embodiments includes a plurality of fins 200 formed over a semiconductor substrate 100. A plurality of sacrificial gate structures 300 are formed over the fins 200. The sacrificial gate structures 300 include a sacrificial gate 310 and a sacrificial gate cap 320. The gate structures 300 are arranged orthogonal to the plurality of the fins 200, which are substantially parallel.

Semiconductor substrate 100 may comprise a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multilayers thereof. As used herein, the term "single crystal" denotes a crystalline solid in which the crystal lattice of the entire sample is substantially continuous and substantially unbroken to the edges of the sample with substantially no grain boundaries. Example silicon substrates include silicon-on-insulator (SOI) substrates, silicon-on-sapphire (SOS) substrates, and the like. The semiconductor substrate 100 is not limited to silicon-containing materials, however, as the substrate may comprise other semiconductor materials, including Ge and compound semiconductors such as GaAs, InAs and other like semiconductors.

Semiconductor substrate 100 may have dimensions as typically used in the art. The substrate may comprise a semiconductor wafer. Example wafer diameters include, but are not limited to, 50, 100, 150, 200, 300 and 450 mm, including ranges between any of the foregoing values. The total substrate thickness may range from 250 microns to 1500 microns, although in particular embodiments, the substrate thickness is in the range of 725 to 775 microns, which corresponds to thickness dimensions commonly used in silicon CMOS processing.

Semiconductor substrate 100 may be a bulk substrate. Alternatively, the semiconductor substrate 100 may be a semiconductor-on-insulator (SOI) substrate and include, from bottom to top, a supporting substrate, an isolation layer, and a semiconductor material layer. The supporting substrate may comprise (100)-oriented silicon or (111)-oriented silicon, for example, and the isolation layer be a buried oxide (BOX) layer. The thickness of the isolation layer may range from 30 to 300 nm, e.g., 30, 50, 100, 150, 200, 250 or 300 nm, including ranges between any of the foregoing values. The isolation layer may comprise, for example, silicon dioxide ($SiO_2$). Alternatively, isolation layer may comprise silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon dioxide. Disposed over the isolation layer in an SOI substrate is a semiconductor material layer, which may be patterned to define a plurality of fins 200.

The semiconductor material layer may comprise any suitable semiconductor material known to those skilled in the art. Example semiconductor materials that form the semiconductor material layer, and which may be used for forming semiconductor fins 200, include silicon (Si), germanium (Ge), silicon germanium (SiGe), III-V compound semiconductors such as GaAs, GaN, GaP, InAs, InSb, ZnSe, and ZnS, and II-VI compound semiconductors such as CdSe, CdS, CdTe, ZnSe, ZnS and ZnTe. In various embodiments, fins 200 may be formed by patterning and then etching the semiconductor material layer.

The patterning process used to form the fins 200 may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. This provides a patterned layer of photoresist atop a hard mask layer (not shown), which is disposed over a top surface of the semiconductor material layer. The pattern provided by the patterned photoresist material is thereafter transferred into the underlying material layer or material layers (e.g., hard mask and semiconductor material layer) utilizing at least one pattern transfer etching process.

In various embodiments, hard mask comprises dielectric material such as silicon dioxide, silicon nitride, silicon oxynitride or combinations thereof. In particular embodiments, the hard mask layer includes a layer of silicon dioxide and an overlying layer of silicon nitride. For example, the hard mask may include a layer of silicon dioxide disposed directly over the top surfaces of the material layer used to form the fins, and a layer of silicon nitride disposed directly over the layer of silicon dioxide.

The pattern transfer etching process is typically an anisotropic etch. In embodiments, a dry etching process such as, for example, reactive ion etching can be used. In other embodiments, a wet chemical etchant can be used. In still further embodiments, a combination of dry etching and wet etching can be used. The pattern transfer etching may stop on the isolation layer of the semiconductor substrate, or a portion of the isolation layer may be removed during the formation of the fins 200. Alternatively, the pattern transfer etch may be stopped prior to reaching isolation layer such that the fins extend upward from an un-etched portion of the semiconductor material layer and thus have a fin height (H) that is less than the thickness of the semiconductor material layer.

In other embodiments, the patterning process may include a sidewall image transfer (SIT) process or a double patterning (DP) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etching process. For instance, the mandrel material layer may be composed of amorphous silicon or polysilicon. The mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that can be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers. The pattern transfer may be achieved by at least one etching process. Examples of etching processes that can be used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material that includes a pair of substantially vertical sidewalls that are parallel to each other. As used herein, a surface is "vertical" if there exists a vertical plane from which the surface does not deviate by more than three times the root mean square roughness of the surface. A "substantially vertical surface" may deviate up to 10% from a vertical surface. Each of a plurality of fins 200 can comprise a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

In various embodiments, each of a plurality of semiconductor fins extends along a lengthwise direction with a substantially rectangular vertical cross-sectional shape. As used herein, a "substantially rectangular shape" is a shape that differs from a rectangular shape only due to photolithographic and process rounding that does not exceed 3 nm. The substantially rectangular vertical cross-sectional shape is a shape within a plane including a vertical direction and a widthwise direction. Plural fins may have identical or substantially identical dimensions, i.e., height and/or width. As used herein, substantially identical dimensions vary by less than 10%, e.g., less than 5%, 2% or 1%.

In various embodiments, the as-formed fins 200 are free standing, i.e., supported only by the substrate. Each fin has a height (H) that may range from 10 nm to 100 nm and a width (W) that may range from 4 nm to 30 nm. Other heights and widths that are less than or greater than the ranges mentioned can also be used. The fins 200 may have an aspect ratio (H/W) ranging from 1 to 5, e.g., 1, 1.5, 2, 3, 4 or 5, including ranges between any of the foregoing values.

In structures comprising plural fins, i.e., a fin array, each fin may be spaced apart from its nearest neighbor by a periodicity or pitch (d) of 10 nm to 100 nm, e.g., 10, 15, 20, 25, 30, 40, 50, 75 or 100 nm, including ranges between any of the foregoing values. Such plural fins are typically oriented parallel to each other and perpendicular to the library logic flow of a circuit.

The semiconductor material forming the fins, and hence the fins 200, may be doped, un-doped, or contain doped and un-doped regions therein. Each doped region within the semiconductor fins 200 may have the same or different doping concentrations and/or conductivities. Doped regions that are present can be formed, for example, by ion implantation, gas phase doping, diffusion from epitaxy, or by dopants that are present in the material used to form the fins. For instance, the semiconductor material layer from which the fins 200 are defined may comprise a dopant prior to forming the fins. By way of example, the semiconductor layer and hence the fins may be initially and uniformly doped and have a dopant concentration in the range of $1 \times 10^{15}$ atoms/cm$^3$ to $1 \times 10^{18}$ atoms/cm$^3$.

Referring still to FIG. 1, a sacrificial gate structure 300 is formed over the top surface and opposing sidewalls of the fins 200. Each sacrificial gate structure 300 is conformal to, and thus wraps over a plurality of the fins. In a typical process, the sacrificial gate structure 300 or "dummy gate" structure is formed by depositing a layer of silicon dioxide (the sacrificial gate insulation material—not shown) on the substrate and over the fins and depositing a layer of polysilicon or amorphous silicon (the sacrificial gate electrode material) on the layer of silicon dioxide. A layer of gate cap material (e.g., silicon nitride) is then deposited above the sacrificial gate electrode material. A patterned etch mask, e.g., photoresist, is then formed above the gate cap layer and the stack of materials are etched anisotropically to define the sacrificial gate structure 300, including the gate insulation layer and the gate electrode material layer, collectively the sacrificial gate 310, and the sacrificial gate cap 320 positioned thereabove.

The sacrificial gate structure 300 has a linear geometry, where a length of each sacrificial gate structure 300 is arranged orthogonal to each of the plurality of parallel fins 200. In various embodiments, the sacrificial gate structure 300 has a width (w) of 10 to 30 nm. The thickness of the sacrificial gate 310 can range from 10 to 120 nm, and the thickness of the sacrificial gate cap 320 can range from 20 to 80 nm.

Sidewall spacers 350 are then formed adjacent to the sacrificial gate structures 300. The sidewall spacers may be deposited by a suitable process such as atomic layer deposition (ALD), chemical vapor deposition (CVD), physical vapor deposition (PVD), thermal oxidation, UV-ozone oxidation, or combinations thereof. In various embodiments, formation of the sidewall spacers 350 includes a conformal deposition process such as chemical vapor deposition (CVD), followed by an anisotropic etch to remove portions of the spacer material(s) from horizontal surfaces.

Sidewall spacers 350 may comprise an oxide, nitride or oxynitride, such as silicon dioxide ($SiO_2$), silicon carbon nitride (SiCN), silicon nitride (Si$_3$N$_4$), or another dielectric material such as a low-k material. In various embodiments, the width of each spacer 350, as measured at the base of the spacer, may range from 5 nm to 100 nm, although lesser and greater widths can be used. In subsequent steps, the sacrificial gate structure will be removed to define a replacement gate cavity between two sidewall spacers 350.

After formation of the sacrificial gate structure 300 and sidewall spacers 350, source and drain junctions (not shown) may be defined on portions of the fins 200 that are not covered by the sacrificial gate structure 300 and sidewall spacers 350.

As will be appreciated, the portion of each semiconductor fin 200 that is not converted into a source region or a drain region by doping, and which underlies a sacrificial gate structure 300, constitutes a channel region. The channel region of the fins may be substantially un-doped. The channel regions collectively function as a channel of a field effect transistor.

In various embodiments, source/drain junctions can be formed by selective epitaxial growth directly onto exposed portions of the fins between the sacrificial gate structures 300. Example epitaxial growth processes include low energy plasma deposition, liquid phase epitaxy, molecular beam epitaxy, or chemical vapor deposition processes that are adapted for selective epitaxy. The thickness of the source and drain junctions may range from 15 to 40 nm, e.g., 15, 20, 25, 30, 35 or 40 nm, including ranges between any of the foregoing values.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Epitaxial source/drain junctions may comprise silicon germanium (SiGe), carbon-doped silicon (Si:C), or another suitable semiconductor material.

By way of example, epitaxial silicon germanium can be deposited using silane (SiH$_4$) and germane (GeH$_4$) as source gases. In exemplary embodiments, the germanium content of the epitaxial silicon germanium may range from 5 to 60 atomic percent, e.g., 5, 10, 20, 50 or 60 at. %, including ranges between any of the foregoing values.

In addition to, or in lieu of, epitaxial source and drain junctions, a blanket doping technique may be used to (further) dope source and drain regions within semiconductor fins 200 to form active regions. As used herein, an "active region" refers to a semiconductor material portion within a semiconductor device through which charge carriers flow during operation of the device. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation.

In alternate embodiments, ion implantation to dope source/drain junctions may be performed before or after the formation of the source/drain junctions. For instance, doping of the source/drain junctions by ion implantation may be used to supplement doping by diffusion from one or more epitaxial layers, or vice versa. The implant dose and implant energy may be selected based on the requirements of the device.

As known to those skilled in the art, doping changes the electron and hole carrier concentrations of an intrinsic semiconductor at thermal equilibrium. A doped layer or region may be p-type or n-type. As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. A p-type dopant is used to manufacture a PFET and an n-type dopant is used to manufacture an NFET.

By way of non-limiting example, a doped region, e.g., source or drain region, is doped with arsenic or phosphorus to form an n-type region. In another example, a doped region is doped with boron to form a p-type region. The dopant concentration within the source and drain regions may range from $1\times10^{19}$ atoms/cm$^3$ to $5\times10^{22}$ atoms/cm$^3$, e.g., $1\times10^{19}$, $2\times10^{19}$, $5\times10^{19}$, $1\times10^{20}$, $2\times10^{20}$, $5\times10^{20}$, $1\times10^{21}$, $2\times10^{21}$, $5\times10^{21}$, $1\times10^{22}$, $2\times10^{22}$ and $5\times10^{22}$ atoms/cm$^3$, including ranges between any of the foregoing values. It will be recognized that whenever a region is identified as a source region or a drain region, it is only for convenience as the source and drain regions could be interchanged as understood in the art.

Each doped region within the semiconductor fins 200 may have the same or different doping concentrations and/or conductivities. The sacrificial gate structure 300 and sidewall spacers 350 can aid in defining the location of the source/drain junctions by shielding portions of the fins 200, e.g., portions within the channel region during epitaxial growth and/or implantation.

Activation annealing may be performed to activate the source/drain junctions. For instance, a drive-in anneal (e.g., 600° C. to 1400° C.) can be used to diffuse dopant species and generate a desired dopant profile. The dopant profile within the fins 200 may be constant or variable. For example, after annealing, the dopant concentration within the fins may vary laterally, i.e., along a widthwise direction of the fins, with a minimum dopant concentration (e.g., $1\times10^{19}$ to $<5\times10^{22}$ atoms/cm$^3$) along a central axis of the fins and a maximum dopant concentration (e.g., $>1\times10^{19}$ to $5\times10^{22}$ atoms/cm$^3$) at opposing sidewall surfaces thereof. In further embodiments, the dopant concentration within the fins may vary along a lengthwise direction of the fins.

Since the adoption of epitaxially-formed source/drain regions, manufacturing schemes have migrated to a "tucked" active format to facilitate uniform epitaxial growth. However, the improvement in uniformity has been achieved at the design area expense of a minimum of one contacted poly pitch between all adjacent active regions that do not terminate on the same electrical net.

In various embodiments, referring to FIGS. 2A and 2B, after forming source/drain junctions, a first dielectric layer 400 is deposited over exposed portions of the fins 200 and over the sidewall spacers 350 between adjacent sacrificial gate structures 300. First dielectric layer 400 may comprise a spin-on oxide or a plasma-enhanced chemical vapor deposited (PECVD) oxide, for example, which will deposit over both the top surface of the fins 200, as well as over the sidewalls of the sidewall spacers 350. Alternatively, a non-conformal dielectric layer can be deposited using a high density plasma (HDP) deposition process.

As seen in FIG. 2B, the first dielectric layer 400 may be planarized, typically using a chemical mechanical polishing process, to expose a top surface of sacrificial gate cap 320. Chemical mechanical polishing (CMP) is a material removal process that uses both chemical reactions and mechanical forces to remove material and planarize a surface.

Referring to FIGS. 3A and 3B, an intermediate architecture is shown where one or more etching processes are performed to remove one or more first sacrificial gate structures 301, i.e., the sacrificial gate cap 320 and the sacrificial gate 310, to define openings 415 and expose the surface 200S of fins 200 within the openings 415 where the fins will be cut.

To form openings 415, an optional masking layer and a photoresist layer (not shown) can be deposited over the structure of FIG. 2. The photoresist layer may include a positive-tone photoresist composition, a negative-tone photoresist composition, or a hybrid-tone photoresist composition. The layer of photoresist material may be formed by a deposition process such as, for example, spin-on coating. The deposited photoresist is then subjected to a pattern of irradiation, and the exposed photoresist material is developed using a conventional resist developer. The pattern of openings provided by the patterned photoresist material exposes selected sacrificial gate structures 301, which may be removed by at least one etching process.

The etching process may be an isotropic etch or an anisotropic etch. In various embodiments, a dry etching process such as, for example, reactive ion etching (RIE) can be used. In other embodiments, a wet chemical etchant can be used. In still further embodiments, a combination of dry etching and wet etching can be used. The photoresist may be consumed during the etch process, stripped after etching of the sacrificial gate structures 301 has been completed, or removed by ashing.

According to various embodiments, the remaining sacrificial gate structures 302, sidewall spacers 350 and first dielectric layer 400 cooperate for form a self-aligned etch mask for removing the portions of the fins exposed within openings 415. As explained in further detail below, remaining (second) sacrificial gate structures 302 will be removed during subsequent processing to define a replacement gate cavity where a replacement gate structure will be formed.

Figure 4A:
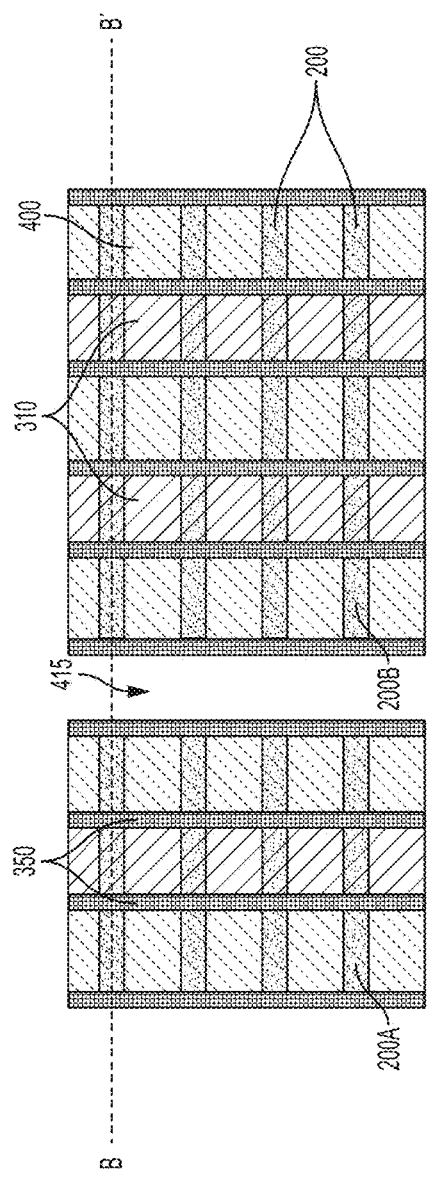
FIG. 4A shows the cutting of fins within the openings formed by removal of the sacrificial gate structures.
Figure 4B:
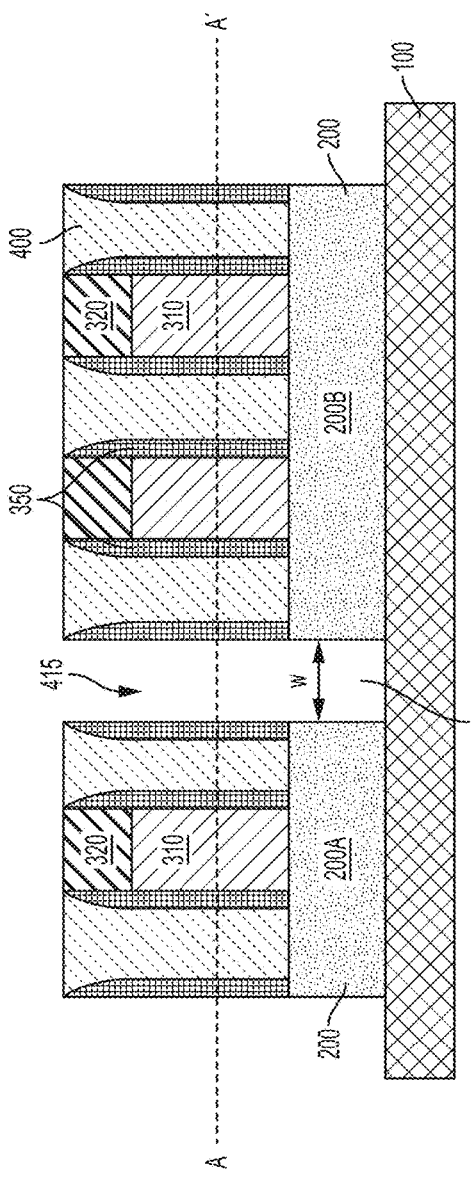
FIG. 4B shows the opening structure after cutting a fin and the alignment of the cut fin ends with the sidewall spacers.

FIGS. 4A and 4B show a first fin segment 200A and a second fin segment 200B defined by removing the exposed portion of each fin 200 at the bottom of opening 415. As will be appreciated, the overlay tolerances of a masking layer (e.g., photoresist layer) required to achieve a gap 425 having a width (w) between opposing ends of cut fin segments 200A, 200B are significantly relaxed due to the self-aligned nature of the process. In other words, the lithographic dimensions needed to remove first sacrificial gate structures 301 can be larger than the dimension of the structure being removed because of etch selectivity between the materials of the sacrificial gate structure 300 and the surrounding structure.

For an SOI fin, the fin cut etch is sufficient to remove the fin in the exposed sacrificial gate opening 415. For a fin formed on a bulk semiconductor substrate, according to certain embodiments, the fin cut etch is sufficiently deep to remove silicon above a punch-through stop doping layer in the substrate to ensure isolation between the first and second fin segments 200A, 200B. In certain embodiments, the fin cut etch completely severs the fin.

According to certain embodiments, the cut ends of fin segments 200A and 200B are aligned with edges of sidewall spacers 350, i.e., each end surface of the cut fin is co-planar with a respective exposed surface of the sidewalls spacers. In such a case, the length of the removed fin segment is substantially equal to the width (w) of the first sacrificial gate structure 301, i.e., 15 to 30 nm.

Referring to FIGS. 5A and 5B, an isolation dielectric layer 500 is deposited into openings 415 and into the gap 425 between opposing ends of cut fin segments 200A, 200B, thus creating dielectric isolation between the active fins without requiring critical dimension (CD) or overlay controls. Isolation dielectric layer 500 may comprise an oxide, nitride or oxynitride such as, for example, silicon dioxide, silicon nitride or silicon oxynitride.

Referring to FIG. 6, shown is a cross-sectional view of a post-replacement metal gate (RMG) device architecture. The structure of FIG. 5B is etched back or polished, e.g., using chemical mechanical polishing, to remove sacrificial gate caps 320 and portions of the sidewall spacers 350, first dielectric layer 400 and isolation dielectric layer 500, and expose a top surface of sacrificial gates 310. As a result, in an intermediate structure, a top surface of the isolation dielectric layer 500 is co-planar with a top surface of an adjacent sacrificial gate structure 300. Then, one or more etching processes are performed to remove the remaining (second) sacrificial gate structures 302 to define a replacement gate cavity where a replacement gate architecture 600 is to be formed.

As known to those skilled in the art, the gate architecture 600 includes a gate dielectric and a gate conductor (not separately shown). A gate dielectric layer may be formed by thermal oxidation, typically at 750-800° C., or alternatively, may be formed by depositing a conformal dielectric layer. The terms "conformal layer" and "conformally deposited layer" denote a layer having a thickness that deviates by no more than 20% (e.g., less than 5, 10 or 20%) from an average thickness of the layer. According to certain embodiments, the gate dielectric layer may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric may be deposited directly onto exposed surfaces of the fins by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing. In various embodiments, the gate dielectric includes a thin layer (e.g., 0.5 nm) of silicon dioxide and an overlying layer of high-k dielectric material.

A gate electrode is formed over the gate dielectric layer(s). The gate electrode may include a conductive material such as polysilicon, although amorphous silicon, a combination of amorphous silicon and polysilicon, polysilicon-germanium, or any other appropriate material may be used. When the gate electrode layer is a silicon material, it may be deposited as a doped layer (in situ doping).

In addition, in some embodiments, it might be advantageous to employ a metal gate conductor layer, such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof.

The gate electrode may comprise one or more layers of such materials such as, for example, a metal stack including a work function metal layer and/or a liner. In various embodiments, the thickness of the work function metal layer is 3 to 5 nm. The gate electrode (e.g., work function metal layer) may be a conformal layer that is formed over exposed surfaces of the structure and then selectively removed to define the desired geometry.

The gate electrode can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

The gate stacks 600 have been planarized with respect to a top surface of sidewall spacers 350, first dielectric layer 400, and isolation dielectric layer 500.

Referring still to FIG. 6, contact openings may be formed by removing first dielectric layer 400 between adjacent sidewall spacers 350 to expose source and drain regions of the fins 200. In certain embodiments, the first dielectric material differs from the sidewall spacer material such that etching of the first dielectric layer 400 may be selective to the sidewall spacers 350.

As shown in FIG. 7, a conductive contact structure 700 may be formed within the contact openings and in electrical contact with fin segments 200A, 200B. In various embodiments, the conductive contact structure 700 may comprise a tungsten-containing material such as tungsten or tungsten silicide. In other embodiments, the conductive contact structure may comprise cobalt, titanium, titanium nitride, nickel or ruthenium, as well as combinations thereof, although other conductive materials may be used. By way of example, the conductive contact structure 700 may include a layer of titanium (5 nm) and a layer of titanium nitride (10 nm). During the annealing, titanium metal reacts with silicon to form titanium silicide.

The conductive contact structure 700 may be deposited by evaporation, sputtering, or other known physical vapor deposition (PVD) techniques, and then planarized using chemical mechanical polishing.

The method disclosed herein is shown in FIGS. 1A-5A as comprising four illustrative fins 200. However, as will be recognized by those skilled in the art, the methods and structures disclosed herein may be employed when manufacturing devices having any number of fins.

The FinFET devices according to the present application may be used in conjunction with a variety of different circuits, such as high performance logic, low power logic or high density memory devices, including high density multi-gigabit DRAMs. Furthermore, FinFET-based devices may be combined with other elements, such as capacitors, resistors, diodes, memory cells, and the like.

The present application provides a device architecture and manufacturing method that overcome many of the deficiencies of conventional structures and methods, where a self-aligned process is used to form an isolation architecture that enables the formation of advanced node FinFET devices arranged at a decreased pitch. An exemplary method includes forming a plurality of sacrificial gate structures overlying channel portions of a semiconductor fin, forming sidewall spacers on sidewalls of the sacrificial gate structures and abutting top and sidewall surfaces of the fin, removing a first sacrificial gate structure from over the channel portion to form an opening exposing the channel portion, and removing the channel portion of the fin exposed through the opening to form a cut fin.

As used herein, the singular forms "a," "an" and "the" include plural referents unless the context clearly dictates otherwise. Thus, for example, reference to a "semiconductor fin" includes examples having two or more such "semiconductor fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, an element such as a layer or region that is "on" or "over" or "disposed over" a substrate or other layer refers to formation above, or in contact with, a surface of the substrate or layer. For example, where it is noted or recited that a layer is disposed over a substrate or other layer, it is contemplated that intervening structural layers may optionally be present between the layer and the substrate. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

While various features, elements or steps of particular embodiments may be disclosed using the transitional phrase "comprising," it is to be understood that alternative embodiments, including those that may be described using the transitional phrases "consisting essentially of" or "consisting," are implied. Thus, for example, implied alternative embodiments to a gate dielectric that comprises silicon dioxide and a high-k dielectric include embodiments where a gate dielectric consists essentially of silicon dioxide and a high-k dielectric and embodiments where a gate dielectric consists of silicon dioxide and a high-k dielectric.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor device, comprising:
    fabricating a plurality of parallel fins on a semiconductor substrate;
    forming a plurality of sacrificial gate structures overlying a channel portion of each of the fins;
    forming sidewall spacers on sidewalls of the sacrificial gate structures, the sidewall spacers abutting top and sidewall surfaces of the fins;
    forming a first dielectric layer over the fins and over the sidewall spacers, the first dielectric layer disposed between adjacent sacrificial gate structures;
    removing a first sacrificial gate structure from over the channel portion of at least one fin to form an opening exposing the channel portion;
    removing the channel portion of the at least one fin exposed through the opening to form a cut fin; and
    forming an isolation dielectric layer within the opening and between opposing end surfaces of the cut fin.

2. The method of claim 1, wherein the sacrificial gate structures have a width of 10 to 30 nm.

3. The method of claim 1, further comprising forming source and drain junctions over exposed portions of the fins prior to forming the first dielectric layer over the fins.

4. The method of claim 1, wherein the first sacrificial gate structure is removed selective to the sidewall spacers.

5. The method of claim 4, wherein an end surface of the cut fin is co-planar with a surface of one of the sidewalls spacers.

6. The method of claim 4, wherein each end surface of the cut fin is co-planar with a respective surface of the sidewalls spacers.

7. The method of claim 1, wherein a distance between opposing end surfaces of the cut fin is 10 to 30 nm.

8. The method of claim 1, wherein the sidewall spacers comprise silicon nitride and the first dielectric layer comprises silicon dioxide.

9. The method of claim 1, wherein the isolation dielectric layer comprises a dielectric material selected from the group consisting of an oxide, a nitride and an oxynitride.

10. The method of claim 1, wherein a top surface of the isolation dielectric layer is co-planar with a top surface of an adjacent sacrificial gate structure.

11. The method of claim 1, further comprising:
    removing a second sacrificial gate structure from over the channel portion of the at least one fin to form a cavity exposing the channel portion; and
    forming a gate stack conformally over exposed portions of the fin within the cavity.

12. The method of claim 1, further comprising:
    removing the first dielectric layer to form contact openings; and
    forming a conductive contact structure within the contact openings.

13. The method of claim 1, wherein removing the channel portion completely severs the at least one fin to form a first fin segment and a second fin segment.

14. The method of claim 13, wherein the isolation dielectric electrically isolates the first fins segment from the second fin segment.

15. A method of forming a semiconductor device, comprising:
    forming a plurality of sacrificial gate structures overlying channel portions of a semiconductor fin;
    forming sidewall spacers on sidewalls of the sacrificial gate structures, the sidewall spacers abutting top and sidewall surfaces of the fin;
    removing a first sacrificial gate structure from over the channel portion to form an opening exposing the channel portion; and
    removing the channel portion of the fin exposed through the opening to form a cut fin.

16. The method of claim 15, wherein an end surface of the cut fin is co-planar with a surface of one of the sidewalls spacers.

17. The method of claim 15, wherein each end surface of the cut fin is co-planar with a respective sidewall spacer exposed surface.

18. The method of claim 15, further comprising forming an isolation dielectric layer within the opening and between opposing end surfaces of the cut fin.

19. The method of claim 15, further comprising:
    removing a second sacrificial gate structure from over the channel portion of the fin to form a cavity exposing the channel portion; and
    forming a gate stack conformally over exposed portions of the fin within the cavity.

* * * * *